US012796204B2

(12) United States Patent
Liu et al.

(10) Patent No.: US 12,796,204 B2
(45) Date of Patent: Nov. 10, 2026

(54) DISPLAY PANEL AND DISPLAY APPARATUS

(71) Applicant: WUHAN CHINA STAR OPTOELECTRONICS SEMICONDUCTOR DISPLAY TECHNOLOGY CO., LTD., Wuhan (CN)

(72) Inventors: Weilai Liu, Wuhan (CN); Bingwen Li, Wuhan (CN); Ping Zhu, Wuhan (CN); Liang Sun, Wuhan (CN)

(73) Assignee: WUHAN CHINA STAR OPTOELECTRONICS SEMICONDUCTOR DISPLAY TECHNOLOGY CO., LTD., Wuhan (CN)

( * ) Notice: Subject to any disclaimer, the term of this patent is extended or adjusted under 35 U.S.C. 154(b) by 368 days.

(21) Appl. No.: 18/518,996

(22) Filed: Nov. 26, 2023

(65) Prior Publication Data

US 2025/0063878 A1 Feb. 20, 2025

(30) Foreign Application Priority Data

Aug. 15, 2023 (CN) ........................ 202311028095.3

(51) Int. Cl.
*H10H 29/14* (2025.01)
*H10H 20/812* (2025.01)
(Continued)

(52) U.S. Cl.
CPC ........ *H10H 29/142* (2025.01); *H10H 20/812* (2025.01); *H10H 20/814* (2025.01); *H10H 20/8512* (2025.01); *H10H 20/8514* (2025.01)

(58) Field of Classification Search
CPC ............... H10H 29/142; H10H 20/812; H10H 20/8512; H10H 29/8513; H10H 29/14;
(Continued)

(56) References Cited

U.S. PATENT DOCUMENTS 10,892,297 B2 * 1/2021 Chae .................. H01L 25/0756
2019/0165038 A1 * 5/2019 Chae .................. H01L 25/0756
(Continued)

FOREIGN PATENT DOCUMENTS

CN 110729283 A 1/2020
CN 111834390 A 10/2020
(Continued)

OTHER PUBLICATIONS

Chinese Office Action issued in corresponding Chinese Patent Application No. 202311028095.3 dated Aug. 9, 2025, pp. 1-7, 16pp.

*Primary Examiner* — Mamadou L Diallo
(74) *Attorney, Agent, or Firm* — The Roy Gross Law Firm, LLC; Roy D. Gross

(57) ABSTRACT

The present disclosure discloses a display panel and a display apparatus. The display panel includes a substrate and at least one light-emitting structure disposed on the substrate, the light-emitting structure includes a first light-emitting element and a color conversion light-emitting element, and the first light-emitting element includes a first color light-emitting layer; and the color conversion light-emitting element and the first light-emitting element are disposed on the substrate in a stacking manner in a first direction, the first direction is a direction perpendicular to the substrate, and the color conversion light-emitting element includes a second color light-emitting layer and a third color color conversion layer disposed in the first direction in a stacking manner with the second color light-emitting layer. The present disclosure may improve light-emitting efficiency of a third color in the display panel, and improve brightness and a display effect of the display panel.

19 Claims, 6 Drawing Sheets

(51) Int. Cl.
*H10H 20/814* (2025.01)
*H10H 20/851* (2025.01)

(58) Field of Classification Search
CPC ............... H10H 29/962; H10H 20/814; H10H 20/8514; H10H 29/8321
See application file for complete search history.

(56) References Cited

U.S. PATENT DOCUMENTS

| | | | | |
|---|---|---|---|---|
| 2022/0208849 | A1* | 6/2022 | Lee | H10H 20/8515 |
| 2022/0262864 | A1* | 8/2022 | Kwon | H10K 59/1201 |
| 2023/0301153 | A1* | 9/2023 | Tak | H10K 59/38 |
| 2023/0361252 | A1* | 11/2023 | Zhu | H10H 20/841 |
| 2023/0403878 | A1* | 12/2023 | Jang | H10K 59/878 |
| 2024/0381731 | A1* | 11/2024 | Jin | G02F 1/1333 |
| 2024/0429351 | A1* | 12/2024 | Choi | H10H 20/8512 |
| 2025/0024730 | A1* | 1/2025 | Yoon | H10K 59/38 |
| 2025/0031545 | A1* | 1/2025 | Yi | H10K 59/122 |
| 2025/0040410 | A1* | 1/2025 | Kim | H10K 59/122 |
| 2025/0098471 | A1* | 3/2025 | Yan | H10K 50/13 |
| 2025/0120240 | A1* | 4/2025 | Li | H10H 29/0364 |
| 2025/0120294 | A1* | 4/2025 | Park | H10K 59/878 |

FOREIGN PATENT DOCUMENTS

| | | | |
|---|---|---|---|
| CN | 111834505 | A | 10/2020 |
| CN | 114175281 | A | 3/2022 |
| CN | 115050873 | A | 9/2022 |
| CN | 115472641 | A | 12/2022 |
| CN | 218918882 | U * | 4/2023 |

* cited by examiner

DISPLAY PANEL AND DISPLAY APPARATUS

CROSS-REFERENCE TO RELATED APPLICATION

This application claims priority to Chinese Patent Application No. 202311028095.3, filed in the China National Intellectual Property Administration on Aug. 15, 2023, entitled "DISPLAY PANEL AND DISPLAY APPARATUS", the entire contents of which are incorporated herein by reference.

FIELD OF INVENTION

The present disclosure relates to the field of display technologies, and in particular, to a display panel and a display apparatus.

BACKGROUND OF INVENTION

A micro light-emitting diode (Micro LED) display panel miniaturizes a conventional LED, and then forms an LED array with micron-level distances, to achieve ultra-high-density pixel resolution. The Micro LED display has characteristics of autonomous light emission. Compared with an organic light-emitting diode (OLED) display panel and a liquid crystal display (LCD) display panel, the Micro LED display panel is easier to adjust the color thereof accurately, has a longer light-emitting life and higher brightness, and also has advantages such as lightweight and power-saving.

Currently, to implement display of other colors or full-color of an inorganic light-emitting diode, a plurality of inorganic light-emitting diodes often need to be stacked together in a horizontal or vertical stacking manner, and the vertical stacking has an advantage of significantly higher PPI than the horizontal stacking. However, since light-emitting efficiency of light-emitting layers of different colors is different, for example, light-emitting efficiency of some colors is less than light-emitting efficiency of other colors, which may affect brightness and a display effect of the display panel.

SUMMARY OF INVENTION

An embodiment of the present disclosure further provides a display panel. The display panel includes a substrate and at least one light-emitting structure disposed on the substrate, and the light-emitting structure includes: a first light-emitting element, including a first color light-emitting layer; and a color conversion light-emitting element disposed on the substrate in a stacking manner in a first direction with the first light-emitting element, the first direction is a direction perpendicular to the substrate, and the color conversion light-emitting element includes a second color light-emitting layer and a third color color conversion layer disposed in the first direction in a stacking manner with the second color light-emitting layer.

According to the foregoing object of the present disclosure, an embodiment of the present disclosure further provides a display apparatus. The display apparatus includes the display panel.

BRIEF DESCRIPTION OF DRAWINGS

The technical solutions and other beneficial effects of the present disclosure will become apparent through a detailed description of specific embodiments of the present disclosure below with reference to the accompanying drawings.

DETAILED DESCRIPTION OF PREFERRED EMBODIMENTS

Figure 1:
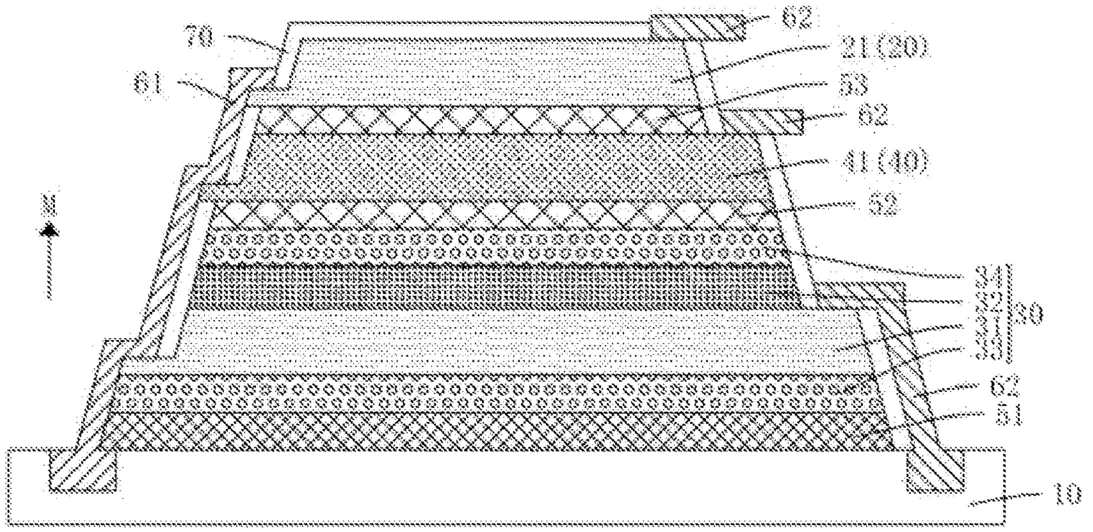
FIG. 1 is a schematic diagram of a structure of a light-emitting structure according to an embodiment of the present disclosure.

The following clearly and completely describes the technical solutions in the embodiments of the present disclosure with reference to the accompanying drawings in the embodiments of the present disclosure. It is clearly that described embodiments are merely some but not all of embodiments of the present disclosure. All other embodiments obtained by a person of ordinary skill in the art based on the embodiments of the present disclosure without creative efforts shall fall within the protection scope of the present disclosure.

Many different implementations or examples are provided in the following disclosure to implement different structures of the present disclosure. To simplify the disclosure of the present disclosure, components and settings in particular examples are described below. Certainly, they are merely examples and are not intended to limit the present disclosure. In addition, in the present disclosure, reference numerals and/or reference symbols may be repeated in different examples. The repetition is for the purposes of simplification and clearness, and does not in itself indicate a relationship between the discussed various implementations and/or configurations. Moreover, the present disclosure provides examples of various particular processes and materials, but a person of ordinary skill in the art may be aware of application of another process and/or use of another material.

An embodiment of the present disclosure further provides a display panel. Refer to FIG. 1, the display panel includes a substrate 10 and at least one light-emitting structure disposed on the substrate 10, and the light-emitting structure includes a first light-emitting element 20 and a color conversion light-emitting element 30.

The first light-emitting element 20 includes a first color light-emitting layer 21, the color conversion light-emitting element 30 and the first light-emitting element 20 are disposed on the substrate 10 in a stacking manner in a first direction M, the first direction M is a direction perpendicular to the substrate 10, and the color conversion light-emitting element 30 includes a second color light-emitting layer 31, and a third color color conversion layer 32 disposed in the first direction M in a stacking manner with the second color light-emitting layer 31.

In an implementation and application process, in the embodiment of the present disclosure, the second color light-emitting layer 31 and the third color color conversion layer 32 are disposed in the color conversion light-emitting element 30 in a stacking manner. In the present disclosure, a second color light-emitting layer 31 with higher light-emitting efficiency may be selected and used to emit light, to excite the third color color conversion layer 32 to emit a light of a third color, thereby improving light-emitting efficiency of the third color in the display panel, and improving brightness and a display effect of the display panel.

Specifically, in an embodiment of the present disclosure, still refer to FIG. 1, the display panel includes a substrate 10 and a plurality of light-emitting structures disposed on the substrate 10, and in FIG. 1, an example in which one light-emitting structure is disposed on the substrate 10 is used for description.

The light-emitting structure includes a color conversion light-emitting element 30, a second light-emitting element 40, and a first light-emitting element 20 that are disposed on the substrate 10 in a stacking manner in a first direction M, and the first direction M is a direction perpendicular to the substrate 10. The color conversion light-emitting element 30 is disposed on the substrate 10. The second light-emitting element 40 is disposed on a side of the color conversion light-emitting element 30 away from the substrate 10, and the first light-emitting element 20 is disposed on a side of the second light-emitting element 40 away from the color conversion light-emitting element 30.

Further, the light-emitting structure may further include a bonding layer, to bond and connect the color conversion light-emitting element 30, the second light-emitting element 40, and the first light-emitting element 20 to the substrate 10 in the first direction M: the light-emitting structure includes a first bonding layer 51 disposed between the substrate 10 and the color conversion light-emitting element 30, a second bonding layer 52 disposed between the color conversion light-emitting element 30 and the second light-emitting element 40, and a third bonding layer 53 disposed between the second light-emitting element 40 and the first light-emitting element 20: the color conversion light-emitting element 30 is connected to the substrate 10 through the first bonding layer 51, the second light-emitting element 40 is connected to a side of the color conversion light-emitting element 30 away from the substrate 10 through the second bonding layer 52, and the first light-emitting element 20 is connected to a side of the second light-emitting element 40 away from the color conversion light-emitting element 30 through the third bonding layer 53.

In an embodiment, the first bonding layer 51 may include Au—Au bonding, Au—Sn bonding, Au—In bonding, Ti—Ti bonding, and Cu—Cu bonding, and a thickness of the first bonding layer 51 may be greater than or equal to 0.1 microns and less than or equal to 3 microns. In addition, when playing a bonding role, the first bonding layer 51 may further play a role of reflecting light, so that the light irradiating in a direction toward the substrate 10 in the light-emitting structure may be reflected back, to improve light-emitting efficiency.

A material of the second bonding layer 52 and a material of the third bonding layer 53 may include a transparent resin material or a silicon oxide material, and both a thickness of the second bonding layer 52 and a thickness of the third bonding layer 53 may be greater than or equal to 0.1 microns and less than or equal to 5 microns, so that the second bonding layer 52 and the third bonding layer 53 may be in a transparent state while playing a bonding role, to avoid affecting light output of the light-emitting structure.

In addition, the display panel further includes at least one first electrode 61 and a plurality of second electrodes 62 that are connected to the light-emitting structure, the color conversion light-emitting element 30, the second light-emitting element 40, and the first light-emitting element 20 are all connected to the first electrode 61, and the color conversion light-emitting element 30, the second light-emitting element 40, and the first light-emitting element 20 are each independently connected to one of the second electrodes 62; and a circuit unit (not shown in the figure) is further disposed in the substrate 10, and both the first electrode 61 and the second electrode 62 are connected to the circuit unit in the substrate 10, to implement signal transmission, so that the color conversion light-emitting element 30, the second light-emitting element 40, and the first light-emitting element 20 may emit light.

It should be noted that the display panel further includes an insulating layer 70, and the insulating layer 70 covers the position of the light-emitting structure except the position at which the first electrode 61 and the second electrode 62 are electrically connected to the light-emitting structure.

In an embodiment of the present disclosure, the first light-emitting element 20 includes a first color light-emitting layer 21. The first color light-emitting layer 21 may include a light-emitting layer, and an N-type doped layer and a P-type doped layer that are located on two sides of the light-emitting layer. In addition, one of the N-type doped layer and the P-type doped layer is connected to the first electrode 61, and the other of the N-type doped layer and the P-type doped layer is connected to the second electrode 62. For example, the first electrode 61 may be a P electrode and connected to the P-type doped layer, and the second electrode 62 in may be an N electrode and connected to the N-type doped layer.

In an embodiment, the first color may be blue, and in the first color light-emitting layer 21, the n-type doped layer includes one or more of GaN, AlGaN, or AlInGaN. A material of the light-emitting layer includes an InGaN/GaN quantum well material, and the P-type doped layer includes the GaN material.

In an embodiment, in the first color light-emitting layer 21, a periodic stress adjustment layer and a current diffusion layer are further disposed between the N-type doped layer and the light-emitting layer, and a periodic stress adjustment layer and a current diffusion layer are further disposed between the P-type doped layer and the light-emitting layer, to enhance stress release and lateral current diffusion in the first color light-emitting layer 21, and improve light-emitting efficiency of the first color light-emitting layer 21.

The second light-emitting element 40 includes a fourth color light-emitting layer 41. The fourth color light-emitting layer 41 may include a light-emitting layer and an N-type doped layer and a P-type doped layer that are located on two sides of the light-emitting layer. In addition, one of the N-type doped layer and the P-type doped layer is connected to the first electrode 61, and the other of the N-type doped layer and the P-type doped layer is connected to the second electrode 62. For example, the first electrode 61 may be a P electrode and connected to the P-type doped layer, and the second electrode 62 may be an N electrode and connected to the N-type doped layer.

In an embodiment, the fourth color may be green, and in the fourth color light-emitting layer 41, the n-type doped layer includes one or more of GaN, AlGaN, or AlInGaN. A material of the light-emitting layer includes an InGaN/GaN quantum well material, and the P-type doped layer includes the GaN material.

In an embodiment, in the fourth color light-emitting layer 41, a periodic stress adjustment layer and a current diffusion layer are further disposed between the N-type doped layer and the light-emitting layer, and a periodic stress adjustment layer and a current diffusion layer are further disposed between the P-type doped layer and the light-emitting layer, to enhance stress release and lateral current diffusion in the fourth color light-emitting layer 41, and improve light-emitting efficiency of the fourth color light-emitting layer 41.

The color conversion light-emitting element 30 includes a second color light-emitting layer 31 and a third color color conversion layer 32 that are disposed in a stacking manner in a first direction M, and the third color color conversion layer 32 is disposed between the second color light-emitting layer 31 and the second light-emitting element 40. Light-emitting efficiency of a quantum well material of the third color is less than light-emitting efficiency of the second color light-emitting layer 31. In other words, in the embodiment of the present disclosure, the second color light-emitting layer 31 with higher light-emitting efficiency is used to emit light, to excite the third color color conversion layer 32 to emit light, thereby improving the light-emitting efficiency of the second color in the light-emitting structure, and improving the brightness and the display effect of the display panel.

In an embodiment, the quantum well material of the third color includes at least one of an InGaN quantum well material, a GaN quantum well material, an AlGaInP quantum well material, or a GaInP quantum well material.

Further, the light-emitting efficiency of the quantum well material of the third color may be further less than the light-emitting efficiency of the first color light-emitting layer 21 and the light-emitting efficiency of the fourth color light-emitting layer 41. In other words, in the embodiment of the present disclosure, the light-emitting element with the lowest light-emitting efficiency in the light-emitting structure is improved, and the second color light-emitting layer 31 with higher light-emitting efficiency is used to emit light, to excite the third color color conversion layer 32 to emit light, thereby improving the light-emitting efficiency of the third color in the light-emitting structure, to improve the display effect of the display panel; and in addition, the light-emitting efficiency of the first color light-emitting layer 21 is greater than the light-emitting efficiency of the fourth color light-emitting layer 41, and the first color light-emitting layer 21 is located above the fourth color light-emitting layer 41, thereby preventing the light of the first color with higher energy from exciting the fourth color light-emitting layer 41, to prevent the light of the first color from affecting normal light emission of the fourth color light-emitting layer 41.

In an embodiment, the color conversion light-emitting element 30 is configured to emit a red light. In other words, the third color is red, and the quantum well material of the third color may be an AlGaInP/GaInP quantum well material; and the third color color conversion layer 32 is configured to excite the red light, and both light-emitting efficiency of a blue quantum well material and light-emitting efficiency of a green quantum well material are greater than light-emitting efficiency of a red quantum well material. Therefore, the second color may be blue or green, to improve the light-emitting efficiency of the red light in the light-emitting structure. As shown in FIG. 1, in the present embodiment, an example in which the second color is blue is used for description.

In an embodiment, the second color light-emitting layer 31 may include a light-emitting layer and an N-type doped layer and a P-type doped layer that are located on two sides of the light-emitting layer. In addition, one of the N-type doped layer and the P-type doped layer is connected to the first electrode 61, and the other of the N-type doped layer and the P-type doped layer is connected to the second electrode 62. For example, the first electrode 61 may be a P electrode and connected to the P-type doped layer, and the second electrode 62 may be an N electrode and connected to the N-type doped layer. In addition, in the second color light-emitting layer 31, the n-type doped layer includes one or more of GaN, AlGaN, or AlInGaN. A material of the light-emitting layer includes an InGaN/GaN quantum well material, and the P-type doped layer includes the GaN material.

In an embodiment, a material of the third color color conversion layer 32 may include a phosphor material or a quantum dot material, for example, may be a red quantum dot material. In addition, the red quantum dot material may be cadmium selenide (CdSe) or perovskite or indium phosphide (InP), and a half-peak width of the red quantum dot material may range from 30 nm to 50 nm.

Further, in the embodiment of the present disclosure, the light-emitting structure further includes a first reflecting layer 33 disposed between the color conversion light-emitting element 30 and the substrate 10, and a second Bragg reflecting layer 34 disposed between the color conversion light-emitting element 30 and the second light-emitting element 40. The first reflecting layer 33 may reflect the light of the second color and the light of the third color, and the second Bragg reflecting layer 34 may reflect the light of the second color. It may be understood that the first reflecting layer 33 may reflect back the light irradiated in a direction of the substrate 10, so that it can continue to participate in light conversion or light emission, to improve light emission efficiency. The second Bragg reflecting layer 34 may reflect back the light of the second color with higher energy, such as a blue light, to prevent the light of the second color with higher energy from irradiating into the second light-emitting element 40, producing a excitation effect on the fourth color light-emitting layer 41, to prevent the light of the second color from affecting the normal light emission of the fourth color light-emitting layer 41.

In an embodiment, the first reflecting layer 33 may include a first Bragg reflecting layer, and the first Bragg reflecting layer may include a first sub-portion and a second sub-portion that are disposed in a stacking manner in the first direction M. The first sub-portion may reflect the light of the second color, the second sub-portion may reflect the light of the third color, and upper and lower positions of the first sub-portion and the second sub-portion may not be limited. The first sub-portion includes a plurality of first sub-layers and a plurality of second sub-layers that are stacked and alternately disposed in the first direction M. In other words, two adjacent first sub-layers are spaced by one second sub-layer, and two adjacent second sub-layers are spaced by one first sub-layer: the second sub-portion includes a plurality of third sub-layers and a plurality of fourth sub-layers that are stacked and alternately disposed in the first direction M. In other words, two adjacent third sub-layers are spaced by one fourth sub-layer, and two adjacent fourth sub-layers are spaced by one third sub-layer; and the second Bragg reflecting layer 34 includes a plurality of fifth sub-layers and a plurality of sixth sub-layers that are stacked and alternately disposed in the first direction M. In other words, two adjacent fifth sub-layers are spaced by one sixth sub-layer, and two adjacent sixth sub-layers are spaced by one fifth sub-layer.

A material of the first sub-layer, a material of the third sub-layer, and a material of the fifth sub-layer may all be a silicon oxide material, such as $SiO_2$, and a material of the second sub-layer, a material of the fourth sub-layer, and a material of the sixth sub-layer may all be a titanium oxide material, such as $Ti_2O_3$.

In an embodiment, the number of each of the first sub-layers, the second sub-layers, the third sub-layers, the fourth sub-layers, the fifth sub-layers, and the sixth sub-layers may all be 15.

Further, in the embodiment of the present disclosure, a thickness of the first sub-layer, a thickness of the second sub-layer, a thickness of the third sub-layer, a thickness of the fourth sub-layer, a thickness of the fifth sub-layer, and a thickness of the sixth sub-layer are designed, so that the first Bragg reflecting layer and the second Bragg reflecting layer 34 may meet the foregoing objective of reflecting light.

The first sub-portion may reflect the light of the second color, the second sub-portion may reflect the light of the third color, and the second Bragg reflecting layer 34 may reflect the light of the second color. Both the thickness of the first sub-layer and the thickness of the second sub-layer are equal to one quarter of the wavelength of the light of the second color. For example, when the second color is blue and the wavelength of the light of the second color is 455 nm, both the thickness of the first sub-layer and the thickness of the second sub-layer are equal to 113.7 nm.

Both the thickness of the third sub-layer and the thickness of the fourth sub-layer are equal to one quarter of the wavelength of the light of the third color; and for example, the third color is red, and the wavelength of the light of the third color is 630 nm, then both the thickness of the third sub-layer and the thickness of the fourth sub-layer are equal to 157.5 nm.

Both the thickness of the fifth sub-layer and the thickness of the sixth sub-layer are equal to one quarter of the wavelength of the light of the second color. For example, when the second color is blue and the wavelength of the light of the second color is 455 nm, both the thickness of the fifth sub-layer and the thickness of the sixth sub-layer are equal to 113.7 nm.

It should be noted that in the embodiment of the present disclosure, the first reflecting layer 33 and the second Bragg reflecting layer 34 are respectively disposed on opposite sides of the color conversion light-emitting element 30, to form a microcavity between the first reflecting layer 33 and the second Bragg reflecting layer 34. While filtering the light of the second color, light extraction efficiency of the light of the third color may be further improved.

Accordingly, in the embodiment of the present disclosure, a second color light-emitting layer 31 and a third color color conversion layer 32 are disposed in a stacking manner in the color conversion light-emitting element 30, and light-emitting efficiency of a quantum well material of the third color is low and lower than the light-emitting efficiency of the second color light-emitting layer 31. In other words, in the present disclosure, a second color light-emitting layer 31 with higher light-emitting efficiency emits light, to excite the third color color conversion layer 32 to emit the light of the third color, thereby improving the light-emitting efficiency of the third color in the display panel, and improving the brightness and the display effect of the display panel.

Figure 2:
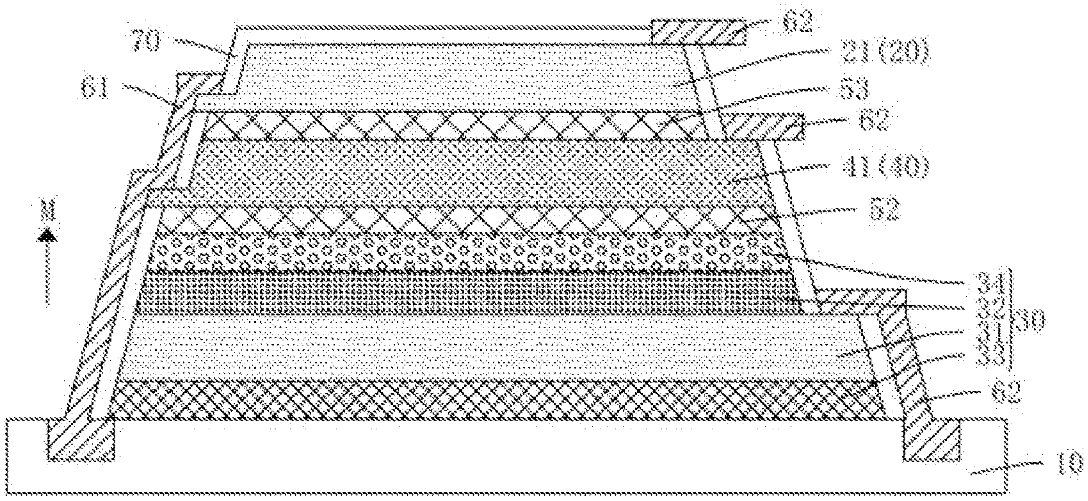
FIG. 2 is another schematic diagram of a structure of a light-emitting structure according to an embodiment of the present disclosure.

In another embodiment of the present disclosure, refer to FIG. 2, a difference between the present embodiment and the embodiment shown in FIG. 1 is: the first reflecting layer 33 is reused as a bonding metal layer, and a material of the first reflecting layer 33 may be a conductive and reflective metal material. The color conversion light-emitting element 30 is connected to the substrate 10 through the bonding metal layer, and may be connected to the circuit unit (not shown in the figure) in the substrate 10 through the bonding metal layer.

Both the second light-emitting element 40 and the first light-emitting element 20 are connected to the first electrode 61, the second light-emitting element 40 and the first light-emitting element 20 are each independently connected to one second electrode 62, and both the first electrode 61 and the second electrode 62 are connected to the circuit unit in the substrate 10: on one hand, the color conversion light-emitting element 30 is connected to the circuit unit in the substrate 10 through the bonding metal layer, and on the other hand, the color conversion light-emitting element 30 is further connected to the first electrode 61 or connected to one second electrode 62. In other words, in addition to being reused as the bonding metal layer, the first reflecting layer 33 may be further reused as the first electrode 61 or the second electrode 62. In FIG. 2, an example in which the bonding metal layer is reused as the first electrode 61 is used.

Accordingly, in the present embodiment, while improving the light-emitting efficiency of the third color, the first reflecting layer 33 is used to be reused as a bonding metal layer and an electrode, thereby reducing the number of first electrodes 61 or second electrodes 62 that are disposed in the color conversion light-emitting element 30, and then only a step on a side of the color conversion light-emitting element 30 needs to be reserved to overlap the first electrode 61 or the second electrode 62, while the other side of the color conversion light-emitting element 30 does not need to be etched to form a step, which may increase a light-emitting area of the color conversion light-emitting element 30 and further improve the light-emitting efficiency of the third color in the display panel; and accordingly, because a step does not need to be reserved on a side of the color conversion light-emitting element 30, sides of the second light-emitting element 40 and the first light-emitting element 20 that correspond to a side of the color conversion light-emitting element 30 at which a step does not need to be reserved may also extend outward, which may also increase a light-emitting area of the second light-emitting element 40 and a light-emitting area of the first light-emitting element 20, and improve the light-emitting efficiency of the second light-emitting element 40 and the first light-emitting element 20. Therefore, in the present embodiment, compared with the embodiment shown in FIG. 1, the light-emitting efficiency of the first light-emitting element 20, the color conversion light-emitting element 30, and the second light-emitting element 40 may be improved without increasing an area of the light-emitting structure, to reduce power consumption of the display panel.

Figure 3:
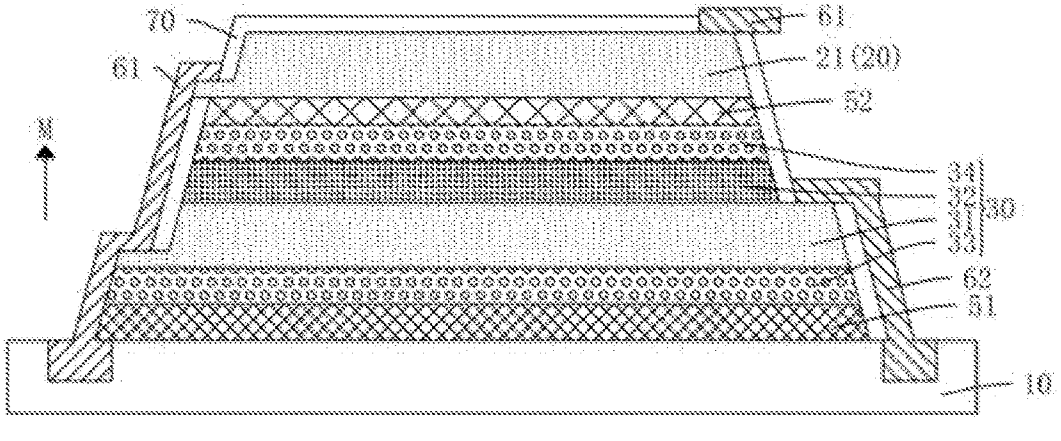
FIG. 3 is another schematic diagram of a structure of a light-emitting structure according to an embodiment of the present disclosure.

In another embodiment of the present disclosure, refer to FIG. 3, a difference between the present embodiment and the embodiment shown in FIG. 1 is: the light-emitting structure includes a color conversion light-emitting element 30 disposed on the substrate 10 and a first light-emitting element 20 disposed at a side of the color conversion light-emitting element 30 away from the substrate 10.

In the present embodiment, the color conversion light-emitting element 30 includes a second color light-emitting layer 31 and a third color color conversion layer 32 that are disposed in a stacking manner in the first direction M, and the light-emitting efficiency of the second color light-emitting layer 31 is greater than the light-emitting efficiency of the quantum well material of the third color.

In an embodiment, the first color may be blue or green, the second color may also be blue or green, and the third color may be red. Because the quantum well material that emits the red light has low light-emitting efficiency, in the present embodiment, a second color (such as blue or green) light-emitting layer 31 with higher light-emitting efficiency is used to emit light, to excite the third color color conversion layer 32 to emit the red light, thereby improving the light-emitting efficiency of the red light in the light-emitting structure, and improving the brightness and the display effect of the display panel.

In addition, the light-emitting structure in the present embodiment further includes a first reflecting layer 33 disposed between the second color light-emitting layer 31 and the substrate 10, and a second Bragg reflecting layer 34 disposed between the second color light-emitting layer 31 and the first light-emitting element 20. In addition, in the present embodiment, the structure of the first reflecting layer 33 and the structure of the second Bragg reflecting layer 34 may be same as those in the embodiment shown in FIG. 1. This is not described herein again.

Accordingly, in the embodiment of the present disclosure, a second color light-emitting layer 31 and a third color color conversion layer 32 are disposed in a stacking manner in the color conversion light-emitting element 30, and light-emitting efficiency of a quantum well material of the third color is low and lower than the light-emitting efficiency of the second color light-emitting layer 31. In other words, in the present disclosure, the second color light-emitting layer 31 with higher light-emitting efficiency is used to emit light, to excite the third color color conversion layer 32 to emit the light of the third color, thereby improving the light-emitting efficiency of the third color in the display panel, and improving the brightness and the display effect of the display panel.

In other embodiments of the present disclosure, the second color may also be ultraviolet light, and the second color light-emitting layer 31 may also emit the ultraviolet light. In other words, the ultraviolet light is used to excite the third color color conversion layer 32 to emit the light of the third color, such as the red light.

In addition, the embodiments of the present disclosure further provide a method for manufacturing the display panel in the foregoing embodiment. Refer to FIG. 1 and FIGS. 4 to 15, the method for manufacturing the display panel includes the following steps.

First, a circuit unit is formed on the substrate 10, and the circuit unit may include a pixel driver array.

Next, a second color light-emitting layer 31 is formed on a first sapphire substrate 81. The second color may be blue, and the second color light-emitting layer 31 includes a light-emitting layer formed on the first sapphire substrate 81 and an N-type doped layer and a P-type doped layer that are located at opposite sides of the light-emitting layer; and in an embodiment, the n-type doped layer includes one or more of GaN, AlGaN, or AlInGaN. A material of the light-emitting layer includes an InGaN/GaN quantum well material, and the P-type doped layer includes the GaN material.

Figure 4:
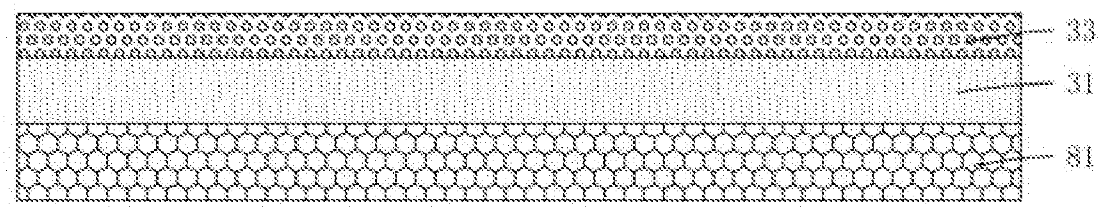
FIGS. 4 to 15 are schematic diagrams of structures of a manufacturing process of a light-emitting structure according to an embodiment of the present disclosure.

Then, the first reflecting layer 33 is formed at a side of the second color light-emitting layer 31 away from the first sapphire substrate 81, and the first reflecting layer 33 includes a first Bragg reflecting layer. As shown in FIG. 4, the first Bragg reflecting layer may include a first sub-portion and a second sub-portion that are disposed in a stacking manner in the first direction M. The first sub-portion may reflect the light of the second color, the second sub-portion may reflect the light of the third color, and upper and lower positions of the first sub-portion and the second sub-portion may not be limited. The first sub-portion includes a plurality of first sub-layers and a plurality of second sub-layers that are stacked and alternately disposed in the first direction M. In other words, two adjacent first sub-layers are spaced by one second sub-layer, and two adjacent second sub-layers are spaced by one first sub-layer: the second sub-portion includes a plurality of third sub-layers and a plurality of fourth sub-layers that are stacked and alternately disposed in the first direction M. In other words, two adjacent third sub-layers are spaced by one fourth sub-layer, and two adjacent fourth sub-layers are spaced by one third sub-layer.

Both a material of the first sub-layer and a material of the third sub-layer may be a silicon oxide material, such as $SiO_2$, and both a material of the second sub-layer and a material of the fourth sub-layer may be a titanium oxide material, such as $Ti_2O_3$.

In an embodiment, the number of each of the first sub-layers, the second sub-layers, the third sub-layers, and the fourth sub-layers may be 15.

Further, the first sub-portion may reflect the light of the second color, and the second sub-portion may reflect the light of the third color. Both the thickness of the first sub-layer and the thickness of the second sub-layer are equal to one quarter of the wavelength of the light of the second color. For example, when the second color is blue and the wavelength of the light of the second color is 455 nm, both the thickness of the first sub-layer and the thickness of the second sub-layer are equal to 113.7 nm.

Both the thickness of the third sub-layer and the thickness of the fourth sub-layer are equal to one quarter of the wavelength of the light of the third color; and for example, the third color is red, and the wavelength of the light of the third color is 630 nm, then both the thickness of the third sub-layer and the thickness of the fourth sub-layer are equal to 157.5 nm.

Figure 5:
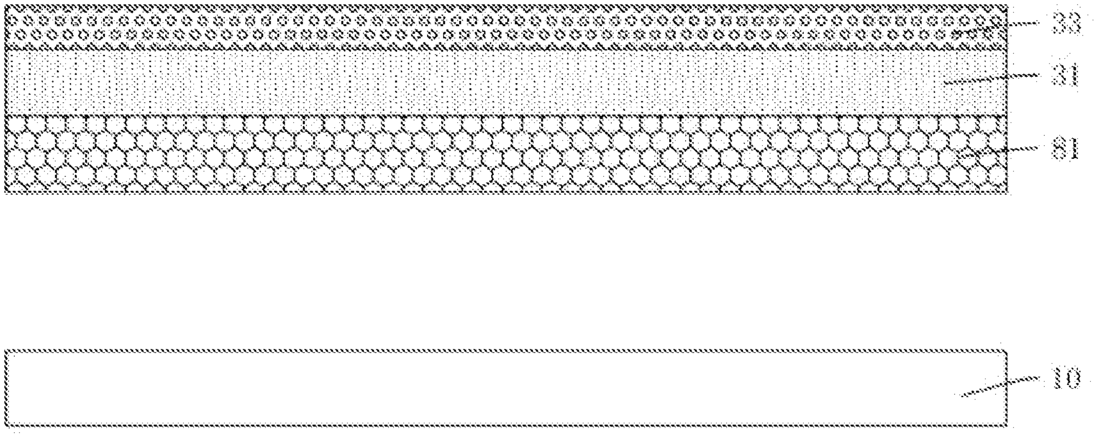
Figure 6:
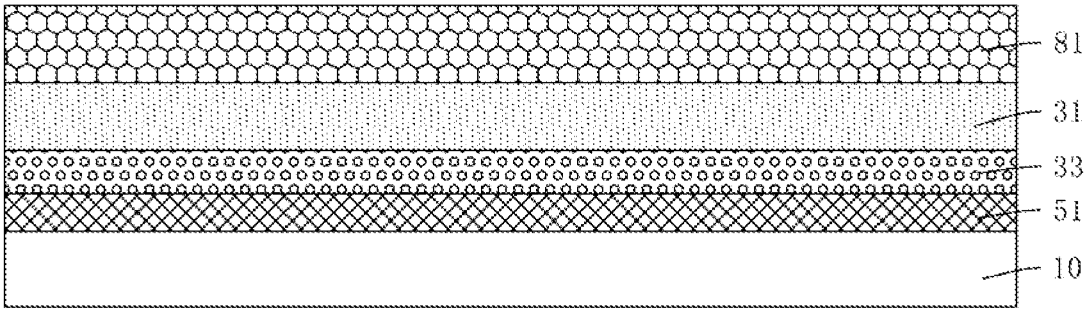

The first bonding layer 51 is used to connect the first reflecting layer 33 and the substrate 10 together, and the second color light-emitting layer 31 is located at a side of the first reflecting layer 33 away from the substrate 10, as shown in FIG. 5 and FIG. 6.

In an embodiment, the first bonding layer 51 may include Au—Au bonding, Au—Sn bonding, Au—In bonding, Ti—Ti bonding, and Cu—Cu bonding, and a thickness of the first bonding layer 51 may be greater than or equal to 0.1 microns and less than or equal to 3 microns. In addition, when playing a bonding role, the first bonding layer 51 may further play a role of reflecting light, so that the light irradiating in a direction of the substrate 10 may be reflected back, to improve light emission efficiency.

Figure 7:
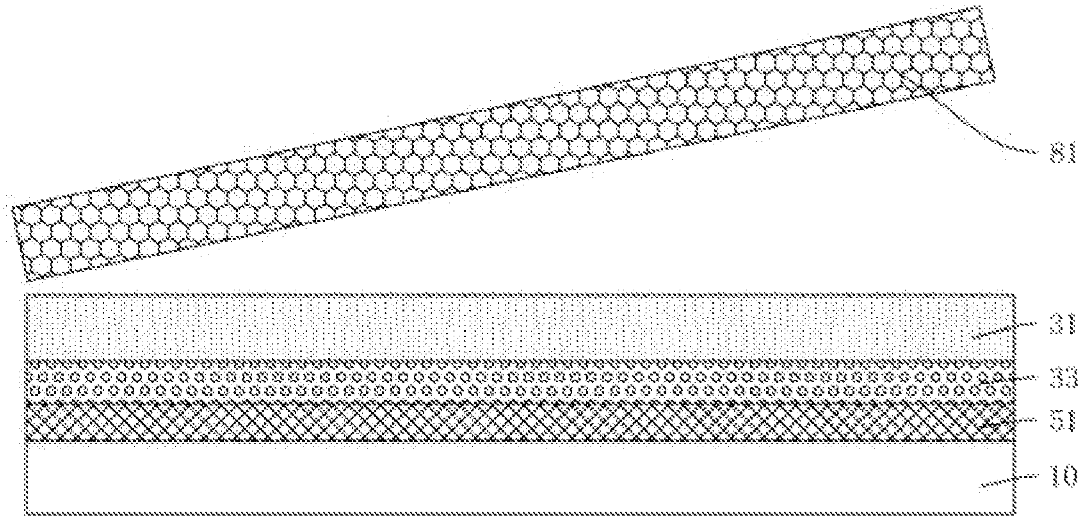
Figure 8:
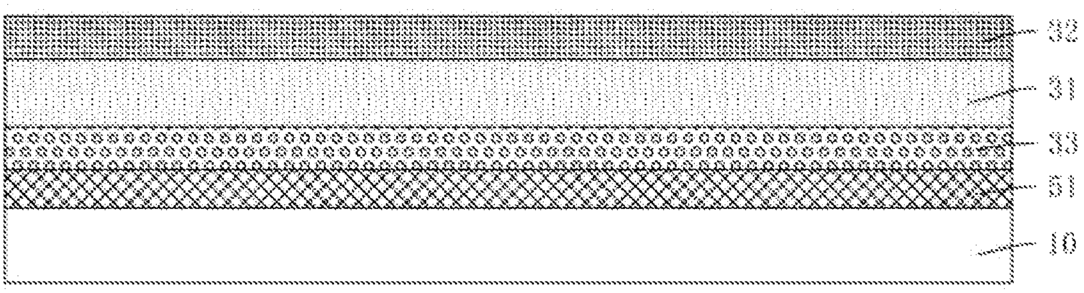

Then, a laser stripping process or wet chemical etching may be used to remove the first sapphire substrate 81, as shown in FIG. 7 and FIG. 8.

Figure 9:
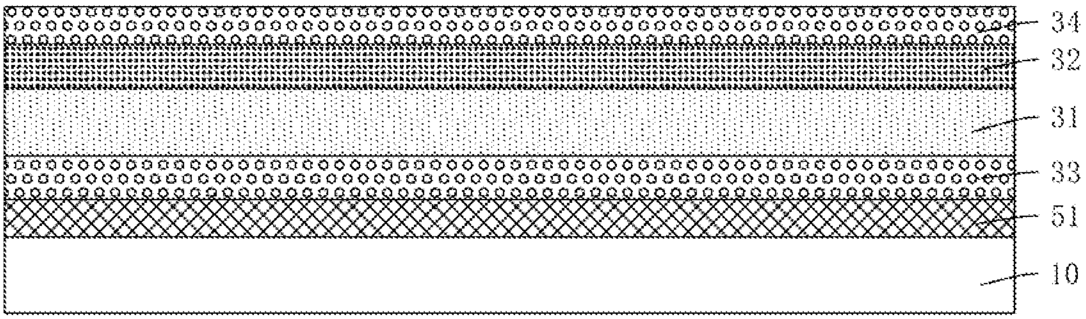

Next, a third color color conversion layer 32 and a second Bragg reflecting layer 34 are sequentially formed at a side of the second color light-emitting layer 31 away from the substrate 10, as shown in FIG. 8 and FIG. 9.

In an embodiment, a material of the third color color conversion layer 32 may include a phosphor material or a quantum dot material, for example, may be a red quantum dot material. In addition, the red quantum dot material may be cadmium selenide (CdSe) or perovskite or indium phosphide (InP), and a half-peak width of the red quantum dot material may range from 30 nm to 50 nm.

In an embodiment, the second Bragg reflecting layer 34 includes a plurality of fifth sub-layers and a plurality of sixth sub-layers that are stacked and alternately disposed in the first direction M. In other words, two adjacent fifth sub-layers are spaced by one sixth sub-layer, and two adjacent sixth sub-layers are spaced by one fifth sub-layer.

A material of the fifth sub-layer may be a silicon oxide material, such as $SiO_2$, a material of the sixth sub-layer may be a titanium oxide material, such as $Ti_2O_3$, and both the number of each of the fifth sub-layers and the sixth sub-layers may be 15.

The second Bragg reflecting layer 34 may reflect the light of the second color. Both the thickness of the fifth sub-layer and the thickness of the sixth sub-layer are equal to one quarter of the wavelength of the light of the second color. For example, when the second color is blue and the wavelength of the light of the second color is 455 nm, both the thickness of the fifth sub-layer and the thickness of the sixth sub-layer are equal to 113.7 nm.

Further, a second light-emitting element 40 is formed on a second sapphire substrate 82, and the second light-emitting element 40 includes a fourth color light-emitting layer 41 formed on the second sapphire substrate 82. In an embodiment, the fourth color may be green, and the fourth color light-emitting layer 41 may include a light-emitting layer and an N-type doped layer and a P-type doped layer that are located at opposite sides of the light-emitting layer. In the fourth color light-emitting layer 41, the n-type doped layer includes one or more of GaN, AlGaN, or AlInGaN. A material of the light-emitting layer includes an InGaN/GaN quantum well material, and the P-type doped layer includes the GaN material.

In an embodiment, in the fourth color light-emitting layer 41, a periodic stress adjustment layer and a current diffusion layer are further disposed between the N-type doped layer and the light-emitting layer, and a periodic stress adjustment layer and a current diffusion layer are further disposed between the P-type doped layer and the light-emitting layer, to enhance stress release and lateral current diffusion in the fourth color light-emitting layer 41, and improve light-emitting efficiency of the fourth color light-emitting layer 41.

Figure 10:
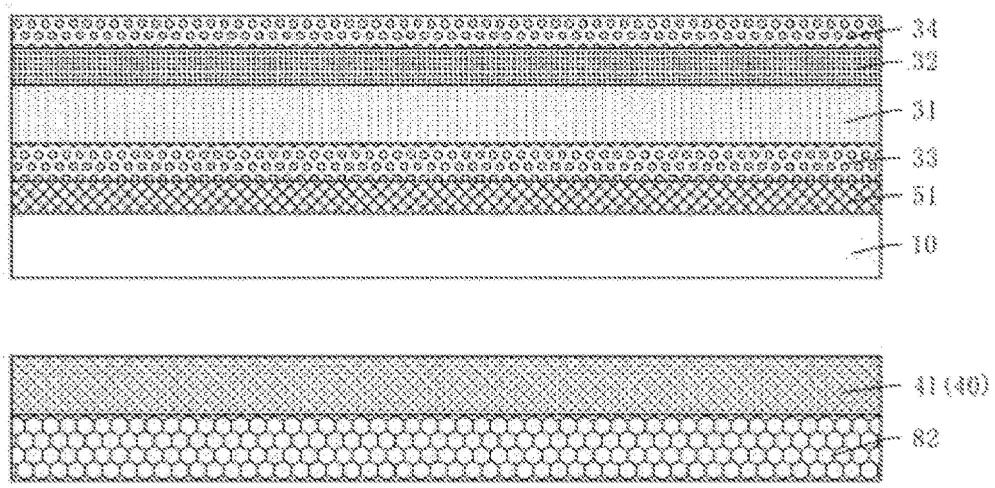
Figure 11:
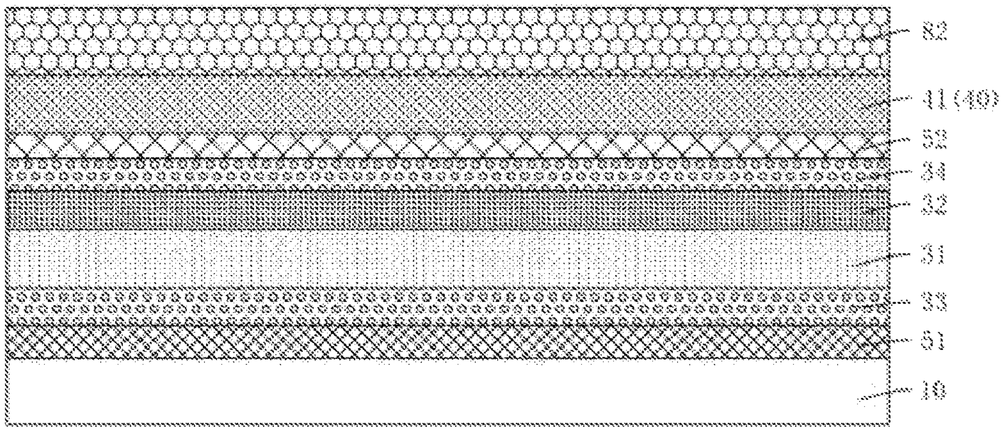

Next, the fourth color light-emitting layer 41 is connected to a side of the second Bragg reflecting layer 34 away from the substrate 10 through the second bonding layer 52, as shown in FIG. 10 and FIG. 11.

In an embodiment, a material of the second bonding layer 52 may include a transparent resin material or a silicon oxide material, and a thickness of the second bonding layer 52 may be greater than or equal to 0.1 microns and less than or equal to 5 microns, so that the second bonding layer 52 may be in a transparent state while playing a bonding role, to avoid affecting light emission of the light-emitting structure.

Figure 12:
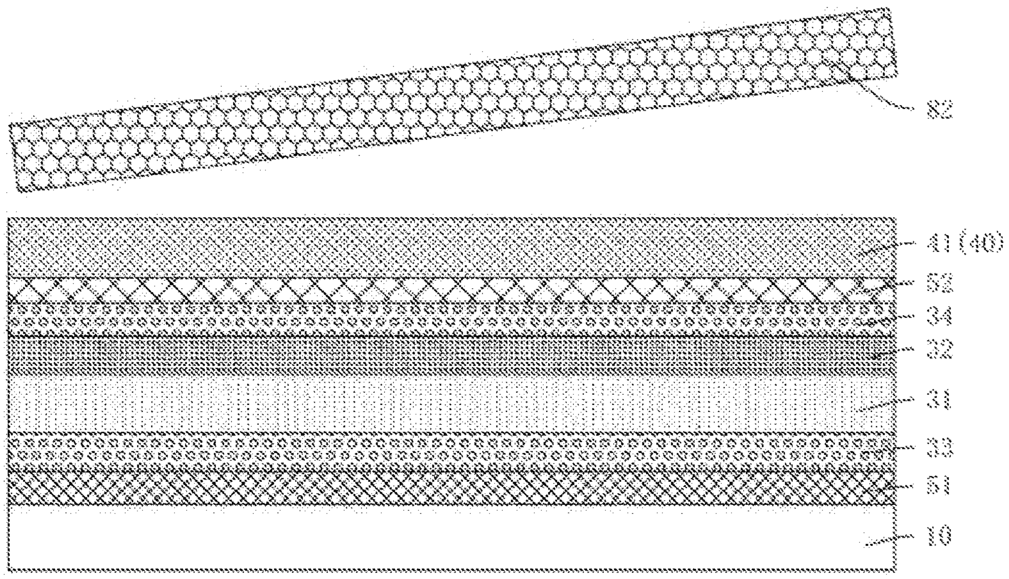

Then, a laser stripping process or wet chemical etching may be used to remove the second sapphire substrate 82, as shown in FIG. 12.

Figure 13:
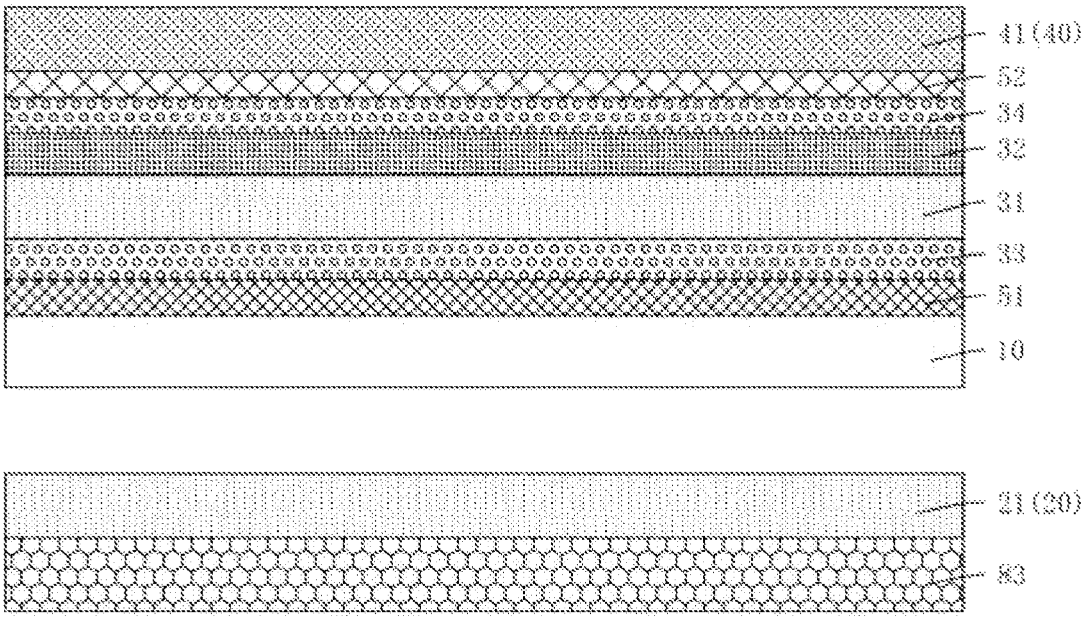

Next, a first light-emitting element 20 is formed on a third sapphire substrate 83, and the first light-emitting element 20 includes the first color light-emitting layer 21 formed on the third sapphire substrate 83, as shown in FIG. 13.

In an embodiment, the first color may be blue, and the first color light-emitting layer 21 may include a light-emitting layer and an N-type doped layer and a P-type doped layer that are located at opposite sides of the light-emitting layer. In the first color light-emitting layer 21, the n-type doped layer includes one or more of GaN, AlGaN, or AlInGaN. A material of the light-emitting layer includes an InGaN/GaN quantum well material, and the P-type doped layer includes the GaN material.

In an embodiment, in the first color light-emitting layer 21, a periodic stress adjustment layer and a current diffusion layer are further disposed between the N-type doped layer and the light-emitting layer, and a periodic stress adjustment layer and a current diffusion layer are further disposed between the P-type doped layer and the light-emitting layer, to enhance stress release and lateral current diffusion in the first color light-emitting layer 21, and improve light-emitting efficiency of the first color light-emitting layer 21.

Figure 14:
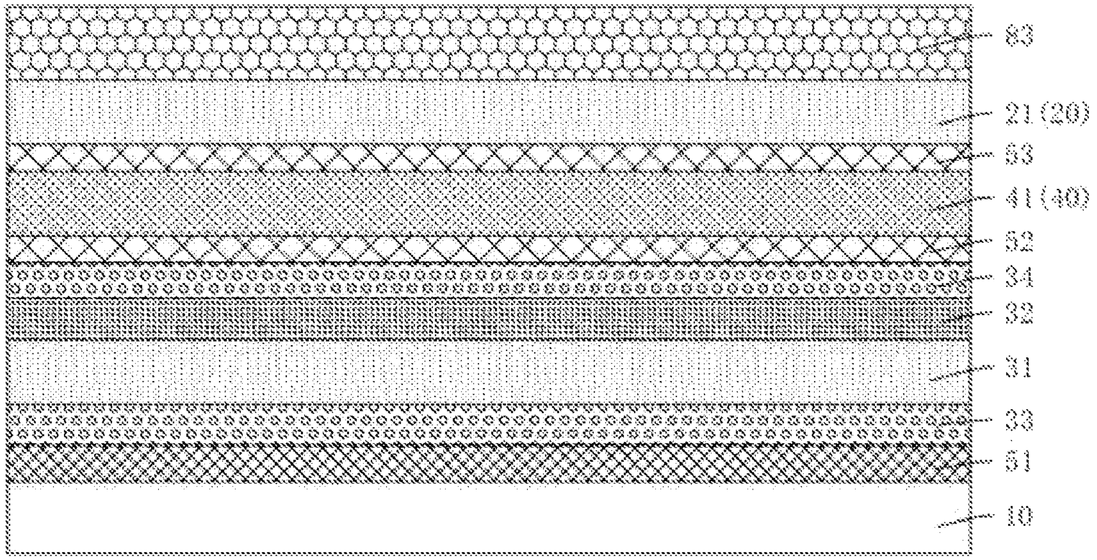

Further, the first color light-emitting layer 21 is connected to a side of the fourth color light-emitting layer 41 away from the substrate 10 through the third bonding layer 53, as shown in FIG. 14.

In an embodiment, a material of the third bonding layer 53 may include a transparent resin material or a silicon oxide material, and a thickness of the third bonding layer 53 may be greater than or equal to 0.1 microns and less than or equal to 5 microns, so that the third bonding layer 53 may be in a transparent state while playing a bonding role, to avoid affecting light emission of the light-emitting structure.

Figure 15:
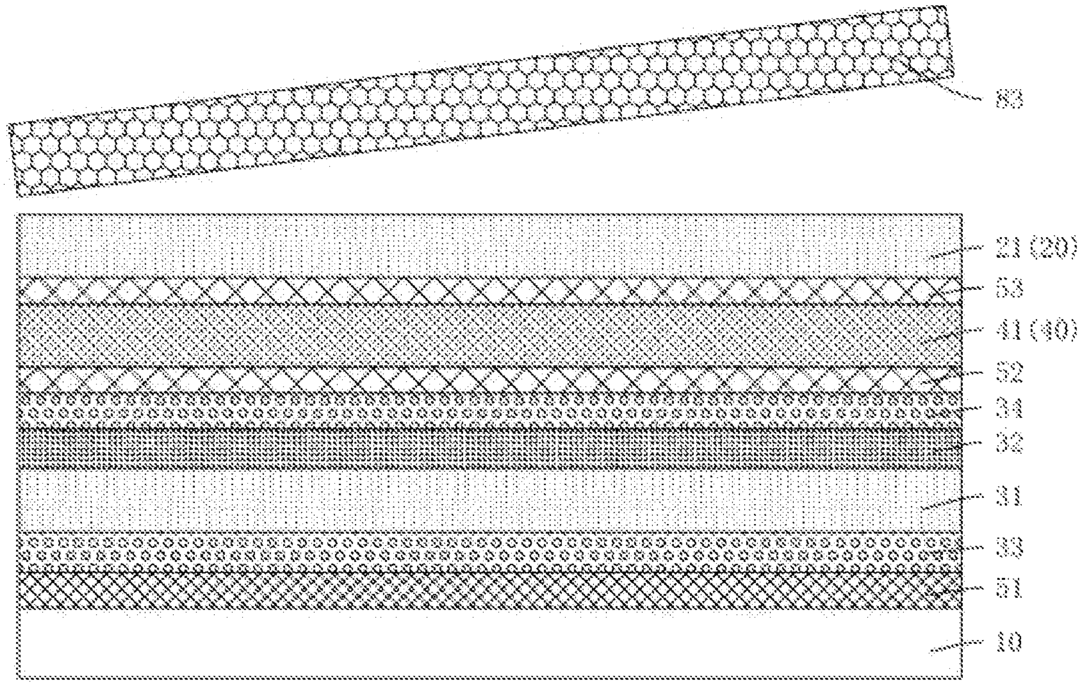

Further, a laser stripping process or wet chemical etching may be used to remove the third sapphire substrate 83, as shown in FIG. 15.

Finally, pattern processing is performed on a stacked structure after removing the third sapphire substrate 83 in FIG. 14. In other words, pattern processing is performed on the color conversion light-emitting element 30, the second light-emitting element 40, and the first light-emitting element 20, to form stepped sides, and accommodate the electrodes; and then, at least one first electrode 61 and a plurality of second electrodes 62 are formed, as shown in FIG. 1.

In the first color light-emitting layer 21, one of the N-type doped layer and the P-type doped layer is connected to the first electrode 61, and the other of the N-type doped layer and the P-type doped layer is connected to the second electrode 62. For example, the first electrode 61 may be a P electrode and connected to the P-type doped layer, and the second electrode 62 may be an N electrode and connected to the N-type doped layer.

In the fourth color light-emitting layer 41, one of the N-type doped layer and the P-type doped layer is connected to the first electrode 61, and the other of the N-type doped layer and the P-type doped layer is connected to the second electrode 62. For example, the first electrode 61 may be a P electrode and connected to the P-type doped layer, and the second electrode 62 may be an N electrode and connected to the N-type doped layer.

In the second color light-emitting layer 31, one of the N-type doped layer and the P-type doped layer is connected to the first electrode 61, and the other of the N-type doped layer and the P-type doped layer is connected to the second electrode 62. For example, the first electrode 61 may be a P electrode and connected to the P-type doped layer, and the second electrode 62 may be an N electrode and connected to the N-type doped layer.

Accordingly, in the embodiment of the present disclosure, a second color light-emitting layer 31 and a third color color conversion layer 32 are disposed in a stacking manner in the color conversion light-emitting element 30, and light-emitting efficiency of a quantum well material of the third color is low and lower than the light-emitting efficiency of the second color light-emitting layer 31. In other words, in the present disclosure, a second color light-emitting layer 31 with higher light-emitting efficiency emits light, to excite the third color color conversion layer 32 to emit the light of the third color, thereby improving the light-emitting efficiency of the third color in the display panel, and improving the brightness and the display effect of the display panel.

In addition, an embodiment of the present disclosure further provides a display apparatus. The display apparatus includes the display panel in the foregoing embodiments.

The display apparatus may include display devices such as a television, a computer, a mobile phone, a tablet, VR or AR.

A display apparatus provided in an embodiment of the present disclosure has the same beneficial effects as the display panel due to the display panel provided in the embodiment of the present disclosure.

In the foregoing embodiments, the descriptions of the embodiments have their respective focuses. For a part that is not described in detail in an embodiment, reference may be made to related descriptions in other embodiments.

A display panel and a display apparatus provided in the embodiments of the present disclosure are described in detail above. Although the principles and implementations of the present disclosure are described by using specific examples in this specification, the descriptions of the foregoing embodiments are merely intended to help understand the technical solution and the core idea of the method of the present disclosure. A person of ordinary skill in the art should understand that modifications can be made to the technical solutions described in the foregoing embodiments, or equivalent replacements can be made to some technical features in the technical solutions; and these modifications or replacements will not cause the essence of corresponding technical solutions to depart from the scope of the technical solutions in the embodiments of the present disclosure.

What is claimed is:

1. A display panel, wherein the display panel comprises a substrate and at least one light-emitting structure disposed on the substrate, and the light-emitting structure comprises:

a first light-emitting element, comprising a first color light-emitting layer; and a color conversion light-emitting element disposed on the substrate in a stacking manner in a first direction with the first light-emitting element, wherein the first direction is a direction perpendicular to the substrate, and the color conversion light-emitting element comprises a second color light-emitting layer and a third color color-conversion layer disposed in the first direction in a stacking manner with the second color light-emitting layer;

wherein the light-emitting structure further comprises a second light-emitting element; the second light-emitting element, the first light-emitting element, and the color conversion light-emitting element are disposed on the substrate in a stacking manner in the first direction, the second light-emitting element comprises a fourth color light-emitting layer, and a light-emitting efficiency of a quantum well material of a third color is less than a light-emitting efficiency of the fourth color light-emitting layer.

2. The display panel as claimed in claim 1, wherein light-emitting efficiency of a quantum well material of a third color is less than light-emitting efficiency of the second color light-emitting layer, and the quantum well material of the third color comprises at least one of an InGaN quantum well material, a GaN quantum well material, an AlGaInP quantum well material, or a GaInP quantum well material.

3. The display panel as claimed in claim 1, wherein light-emitting efficiency of a quantum well material of a third color is less than light-emitting efficiency of the first color light-emitting layer.

4. The display panel as claimed in claim 1, wherein the color conversion light-emitting element is disposed on the substrate, the second light-emitting element is disposed at a side of the color conversion light-emitting element away from the substrate, and the first light-emitting element is disposed at a side of the second light-emitting element away from the color conversion light-emitting element; and wherein light-emitting efficiency of the first color light-emitting layer is greater than the light-emitting efficiency of the fourth color light-emitting layer.

5. The display panel as claimed in claim 4, wherein the light-emitting structure further comprises a first reflecting layer disposed between the color conversion light-emitting element and the substrate, and a second Bragg reflecting layer disposed between the color conversion light-emitting element and the second light-emitting element; and wherein the first reflecting layer reflects a light of a second color and a light of the third color, and the second Bragg reflecting layer reflects the light of the second color.

6. The display panel as claimed in claim 5, wherein the first reflecting layer comprises a first Bragg reflecting layer, the first Bragg reflecting layer comprises a first sub-portion and a second sub-portion that are disposed in a stacking manner in the first direction, the first sub-portion reflects the light of the second color, and the second sub-portion reflects the light of the third color; and the first sub-portion comprises a plurality of first sub-layers and a plurality of second sub-layers that are stacked and alternately disposed, the second sub-portion comprises a plurality of third sub-layers and a plurality of fourth sub-layers that are stacked and alternately disposed, and the second Bragg reflecting layer comprises a plurality of fifth sub-layers and a plurality of sixth sub-layers that are stacked and alternately disposed; and wherein both a thickness of the first sub-layer and a thickness of the second sub-layer are equal to one quarter of a wavelength of the light of the second color, both a thickness of the third sub-layer and a thickness of the fourth sub-layer are equal to one quarter of a wavelength of the light of the third color, and both a thickness of the fifth sub-layer and a thickness of the sixth sub-layer are equal to one quarter of the wavelength of the light of the second color.

7. The display panel as claimed in claim 6, wherein a material of the first sub-layer, a material of the third sub-layer, and a material of the fifth sub-layer each comprise a silicon oxide material, and a material of the second sub-layer, a material of the fourth sub-layer, and a material of the sixth sub-layer each comprise a titanium oxide material.

8. The display panel as claimed in claim 5, wherein the display panel further comprises at least one first electrode and a plurality of second electrodes that are connected to the light-emitting structure, at least the first color light-emitting layer and the fourth color light-emitting layer are connected to the first electrode, and the first color light-emitting layer and the fourth color light-emitting layer are each independently connected to one of the second electrodes.

9. The display panel as claimed in claim 8, wherein the first reflecting layer is reused as a bonding metal layer, the color conversion light-emitting element is connected to the substrate through the bonding metal layer, and the second color light-emitting layer is connected to the first electrode, or connected to one of the second electrodes.

10. The display panel as claimed in claim 1, wherein the first color is blue or green, the second color is blue or green, and the third color is red.

11. The display panel as claimed in claim 10, wherein the fourth color is same as or different from the second color.

12. The display panel as claimed in claim 1, wherein a material of the third color color-conversion layer comprises a quantum dot material or a phosphor material.

13. A display apparatus, wherein the display apparatus comprises a display panel, the display panel comprises a substrate and at least one light-emitting structure disposed on the substrate, and the light-emitting structure comprises:

a first light-emitting element, comprising a first color light-emitting layer; and a color conversion light-emitting element disposed on the substrate in a stacking manner in a first direction with the first light-emitting element, wherein the first direction is a direction perpendicular to the substrate, and the color conversion light-emitting element comprises a second color light-emitting layer and a third color color-conversion layer disposed in the first direction in a stacking manner with the second color light-emitting layer;

wherein the light-emitting structure further comprises a second light-emitting element; the second light-emitting element, the first light-emitting element, and the color conversion light-emitting element are disposed on the substrate in a stacking manner in the first direction, the second light-emitting element comprises a fourth color light-emitting layer, and a light-emitting efficiency of a quantum well material of a third color is less than a light-emitting efficiency of the fourth color light-emitting layer.

14. The display apparatus as claimed in claim 13, wherein light-emitting efficiency of a quantum well material of a third color is less than light-emitting efficiency of the second color light-emitting layer, and the quantum well material of the third color comprises at least one of an InGaN quantum well material, a GaN quantum well material, an AlGaInP quantum well material, or a GaInP quantum well material.

15. The display apparatus as claimed in claim 13, wherein light-emitting efficiency of a quantum well material of a third color is less than light-emitting efficiency of the first color light-emitting layer.

16. The display apparatus as claimed in claim 13, wherein the color conversion light-emitting element is disposed on the substrate, the second light-emitting element is disposed at a side of the color conversion light-emitting element away from the substrate, and the first light-emitting element is disposed at a side of the second light-emitting element away from the color conversion light-emitting element; and wherein light-emitting efficiency of the first color light-emitting layer is greater than the light-emitting efficiency of the fourth color light-emitting layer.

17. The display apparatus as claimed in claim 16, wherein the light-emitting structure further comprises a first reflecting layer disposed between the color conversion light-emitting element and the substrate, and a second Bragg reflecting layer disposed between the color conversion light-emitting element and the second light-emitting element; and wherein the first reflecting layer reflects a light of a second color and a light of the third color, and the second Bragg reflecting layer reflects the light of the second color.

18. The display apparatus as claimed in claim 17, wherein the first reflecting layer comprises a first Bragg reflecting layer, the first Bragg reflecting layer comprises a first sub-portion and a second sub-portion that are disposed in a stacking manner in the first direction, the first sub-portion reflects the light of the second color, and the second sub-portion reflects the light of the third color; and the first sub-portion comprises a plurality of first sub-layers and a plurality of second sub-layers that are stacked and alternately disposed, the second sub-portion comprises a plurality of third sub-layers and a plurality of fourth sub-layers that are stacked and alternately disposed, and the second Bragg reflecting layer comprises a plurality of fifth sub-layers and a plurality of sixth sub-layers that are stacked and alternately disposed; and wherein both a thickness of the first sub-layer and a thickness of the second sub-layer are equal to one quarter of a wavelength of the light of the second color, both a thickness of the third sub-layer and a thickness of the fourth sub-layer are equal to one quarter of a wavelength of the light of the third color, and both a thickness of the fifth sub-layer and a thickness of the sixth sub-layer are equal to one quarter of the wavelength of the light of the second color.

19. A display panel, wherein the display panel comprises a substrate and at least one light-emitting structure disposed on the substrate, and the light-emitting structure comprises:

a first light-emitting element, comprising a first color light-emitting layer; and a color conversion light-emitting element disposed on the substrate in a stacking manner in a first direction with the first light-emitting element, wherein the first direction is a direction perpendicular to the substrate, and the color conversion light-emitting element comprises a second color light-emitting layer and a third color color-conversion layer disposed in the first direction in a stacking manner with the second color light-emitting layer;

wherein the first color light-emitting layer, the second color light-emitting layer and the third color color-conversion layer are configured to emit light of different colors, respectively.

* * * * *